(12) United States Patent
Tanizaki et al.

(10) Patent No.: US 6,284,431 B1
(45) Date of Patent: *Sep. 4, 2001

(54) PHOTOSENSITIVE ELEMENT FOR FLEXOGRAPHIC PRINTING

(75) Inventors: Akio Tanizaki; Hiroko Nakano, both of Fuji (JP)

(73) Assignee: Asahi Kasei Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/153,856

(22) Filed: Sep. 16, 1998

(30) Foreign Application Priority Data

Sep. 16, 1997 (JP) .................................................. 9-268223

(51) Int. Cl.⁷ ....................................................... G03F 1/00
(52) U.S. Cl. ................................... 430/273.1; 430/270.1; 430/271.1; 430/281.1; 430/944; 430/306
(58) Field of Search .............................. 430/273.1, 281.1, 430/306

(56) References Cited

U.S. PATENT DOCUMENTS

| | | | |
|---|---|---|---|
| 4,045,231 | * | 8/1977 | Toda et al. .............................. 96/115 |
| 4,323,636 | * | 4/1982 | Chen .................................. 430/271.1 |
| 4,460,675 | * | 7/1984 | Gruetzmacher et al. ............. 430/300 |
| 4,607,078 | * | 8/1986 | Dergazarian .......................... 525/64 |
| 5,223,576 | * | 6/1993 | Nakano et al. ...................... 525/133 |
| 5,262,275 | * | 11/1993 | Fan ...................................... 430/273 |
| 5,506,086 | * | 4/1996 | Van Zoeren ......................... 430/201 |
| 5,654,125 | | 8/1997 | Fan et al. . |

FOREIGN PATENT DOCUMENTS

| | | |
|---|---|---|
| 0741330A1 | 11/1996 | (EP) . |
| 0741330 | * 11/1996 | (EP) . |
| 0767407A1 | 4/1997 | (EP) . |
| WO 9323252 | 11/1993 | (WO) . |
| 9403838A1 | 2/1994 | (WO) . |
| 9403839A1 | 2/1994 | (WO) . |

OTHER PUBLICATIONS

Shell Chemical Online Literature; www2.shellchemical.com/CMM\WEB\GlobChem.NSF/Literature/SC:68–96; p. 7, Apr. 26, 1999.*

* cited by examiner

Primary Examiner—Janet Baxter
Assistant Examiner—Yvette M. Clarke
(74) Attorney, Agent, or Firm—Birch, Stewart, Kolasch & Birch, LLP

(57) ABSTRACT

A photosensitive element for flexographic printing which is composed of (a) a support layer; (b) a photosensitive resin layer which comprises, as a binder polymer, a thermoplastic elastomer obtained by polymerization of a monovinyl-substituted aromatic hydrocarbon and a conjugated diene, said photosensitive resin layer (b) being placed on the support layer (a); and (c) a non-infrared ray-shielding layer which can be ablated with an infrared laser, and comprises a binder polymer, an infrared absorber and a non-infrared ray-shielding material, said non-infrared ray-shielding layer (c) being placed on the photosensitive resin layer (b), wherein the binder polymer of the non-infrared ray-shielding layer (c) is a copolymer composed of a monovinyl-substituted aromatic hydrocarbon and a conjugated diene or a hydrogenation product of a copolymer composed of a monovinyl-substituted aromatic hydrocarbon and a conjugated diene.

11 Claims, No Drawings

PHOTOSENSITIVE ELEMENT FOR FLEXOGRAPHIC PRINTING

BACKGROUND OF THE INVENTION

1. Field of the Invention

This invention relates to a photosensitive element for flexographic printing and is applicable to a plate-making process by which a digitized image is directly drawn by an infrared laser without using a phototool such as a negative film.

2. Description of the Related Art

A conventional photosensitive element for flexographic printing is generally composed of a polyester film or the like as a support and a photosensitive resin layer placed thereon comprising a thermoplastic elastomer, at least one monomer and at least one radiation-sensitive initiator. In the procedure for making a flexographic printing plate from such a photosensitive element for flexographic printing, the whole surface of the element is first exposed to an ultraviolet light through the support (back exposure) to prepare a thin, uniform cured layer. Subsequently, the photosensitive resin layer surface is subjected to image exposure (relief exposure) and the unexposed portion is removed by washing with a developing solvent to obtain the desired image, namely relief image, from which a printing plate is obtained. In this case, a thin film called slip layer or protective layer is often provided on the photosensitive resin layer for the purpose of smoothing contact between the photosensitive resin layer and a phototool such as a negative film.

There is also known a photosensitive element for flexographic printing on which the digitized image information can be directly drawn without using a phototool such as a negative film and a plate-making process using the photosensitive element. In the procedure thereof, the "non-infrared ray"-shielding thin layer provided on a photosensitive resin layer is ablated with an infrared laser based on the digital information processed by a computer, to obtain the desired image. After drawing an image on the photosensitive resin layer, a conventional plate-making process can be applied to the photosensitive element in which the photosensitive resin layer has an image drawn thereon.

That is to say, using the existing exposure apparatus, the photosensitive element is subjected to back exposure from the support side and then to relief exposure from the side of the image drawn with an infrared laser, and thereafter, subjected to development step, whereby a flexographic printing plate is formed. As compared with the conventional method using a phototool such as a negative film, when an amendment to the image has become necessary, the above plate-making process does not require the preparation of a new phototool such as a negative film and the digitized image data can be amended on a computer, so that the above plate-making process has such an advantage that time and labor can be saved. Moreover, as compared with the conventional phototool such as a negative film, the photosensitive element is advantageous in dimensional stability, and this results in an improvement in reproducibility of relief image which brings about an improvement in printing quality.

As to the non-infrared ray-shielding layer which can be ablated with an infrared laser, JP-A-8-305,030 describes that as the binder polymer therefor, there is used a polymer substantially incompatible with at least one low molecular weight material of the photosensitive resin layer. As examples of the binder polymer to be used for the purpose of realizing such characteristics, said publication mentions polyamide, polyvinyl alcohol, polyvinyl alcohol/polyethylene glycol graft copolymer, amphoteric interpolymer, alkyl cellulose, hydroxyalkyl cellulose, nitrocellulose, copolymer of ethylene and vinyl acetate, cellulose acetate butyrate, polybutyral, cyclized rubber, copolymer of styrene and acrylic acid, polyvinyl pyrrolidone and copolymer of polyvinyl pyrrolidone and vinyl acetate; combinations of polymers selected from a group of these polymers; and the like.

However, a non-infrared ray-shielding layer prepared from these polymers often causes an inconvenience resulting from its poor compatibility with the low molecular weight material of the photosensitive resin layer. For example, it is unavoidable that the combination of the non-infrared ray-shielding layer with the photosensitive resin layer becomes such a combination that the affinity between the two is small. Therefore, the adhesion between the two is small, and when the cover sheet is peeled before the drawing of an image with an infrared laser, such a phenomenon occurs often that the non-infrared ray-shielding layer is partially peeled from the photosensitive resin layer and consequently the partially peeled non-infrared ray-shielding layer is removed as attached to the cover sheet. When a plate is set to a drum of a laser image drawing machine to draw an image, the plate is generally fixed to the drum with a tape on the plate. However, when the adhesion between the non-infrared ray-shielding layer and the photosensitive layer is not sufficient, this portion is peeled during the rotation of the drum to cause the detachment of the plate, resulting in serious damage of both the plate and the laser image drawing machine. In order to prevent such an inconvenience, after the non-infrared ray-shielding layer around the plate is peeled from the photosensitive resin layer in advance, the plate is fixed at that portion with a tape. However, this step remarkably reduces the productivity of the plate-making process.

Furthermore, there is a difference in dissolvability in a developing solvent between the photosensitive resin layer and the non-infrared ray-shielding layer prepared using the above-mentioned polymers. Therefore, there is a problem that a solvent suitable inherently for the photosensitive resin layer occupying a major portion of the photosensitive element for flexographic printing cannot be used as a developer.

For example, in the photosensitive resin layer of a typical photosensitive element for flexographic printing, a thermoplastic elastomer composed of a polymer of a styrene derivative and a conjugated diene monomer is used as its binder polymer.

As a developer, chlorine-free solvents have been used recently due to concerns of protecting the environment, which are a mixture of a petroleum hydrocarbon or ester solvent with an alcohol. However, when these chlorine-free solvents are used, there may be a problem in some cases due to the difference in dissolvability in the solvent between the photosensitive resin layer and the non-infrared ray-shielding layer which can be ablated with an infrared laser.

For example, when a photosensitive resin layer in which a thermoplastic elastomer is used as a binder polymer is combined with a non-infrared ray-shielding layer in which a polyamide is used as a binder polymer, the use of 3-methoxybutyl acetate as a developing solvent results in an insufficient removal of the non-infrared ray-shielding layer by washing. In addition, even when combined with a non-infrared ray-shielding layer in which cellulose acetate butyrate is used as a binder polymer, the use of a combination of a petroleum hydrocarbon with an alcohol as a developing solvent similarly results in an insufficient dissolvability and accordingly the problem that the depth of relief after the development is not uniform. Moreover, the non-infrared ray-shielding layer which has not been completely dissolved in the developing solvent becomes swollen with the solvent and floats in the developing tank. This swollen layer floating in the tank causes a blocking of the piping for circulating the liquid, or often causes serious problems in the plate-making step such as re-attachment of the floating material to the plate and the like.

An object of this invention is to provide a photosensitive element for flexographic printing applicable to the plate-making process in which a digitized image is drawn with an infrared laser directly without using a phototool such as a negative film, wherein a novel non-infrared ray-shielding layer which can be ablated with an infrared laser is used to make a good adhesion of the non-infrared ray-shielding layer to the photosensitive resin layer, thereby solving such problems that the peeling of the non-infrared ray-shielding layer can cause during the peeling of a cover sheet, and the like.

Another object of the invention is to provide a photosensitive element for flexographic printing which enables the selection of a developing solvent in a broad range.

SUMMARY OF THE INVENTION

The present inventors have made extensive research for achieving the above-mentioned objects and have consequently completed this invention.

According to this invention, the following are provided:
(1) A photosensitive element for flexographic printing comprising (a) a support layer, (b) a photosensitive resin layer which is placed on the support layer (a) and comprises a thermoplastic elastomer obtained by polymerization of a monovinyl-substituted aromatic hydrocarbon and a conjugated diene as a binder polymer, and (c) a non-infrared ray-shielding layer which can be ablated with an infrared laser, said non-infrared ray-shielding layer (c) being placed on the photosensitive resin layer (b) and comprising a binder polymer, an infrared absorber and an infrared ray-shielding material, wherein the binder polymer of the infrared ray-shielding layer (c) is a copolymer of a monovinyl-substituted aromatic hydrocarbon and a conjugated diene or a hydrogenation product of a copolymer of a monovinyl-substituted aromatic hydrocarbon and a conjugated diene.
(2) The photosensitive element for flexographic printing according to (1) above, wherein the photo-sensitive resin (b) comprises, in addition to the thermoplastic elastomer, at least one ethylenically unsaturated monomer capable of being radically polymerized and a photopolymerization initiator.
(3) The photosensitive element for flexographic printing according to (1) or (2) above, wherein (d) a cover sheet is further provided on the non-infrared ray shielding layer (c).
(4) The photosensitive element for flexographic printing according to any one of (1) to (3) above, wherein the binder polymer of the non-infrared ray-shielding layer (c) is a styrene-conjugated diene copolymer having a styrene content of 60 to 90% by weight.
(5) The photosensitive element for flexographic printing according to any one of (1) to (3) above, wherein the binder polymer of the non-infrared ray-shielding layer (C) is a hydrogenation product of a styrene-conjugated diene copolymer having a styrene content of 10 to 50% by weight.

The photosensitive element for flexographic printing of this invention uses a novel non-infrared ray-shielding layer which can be ablated with an infrared laser, whereby the adhesion of the non-infrared ray-shielding layer to the photosensitive resin layer is good, such problems are solved such as peeling of the non-infrared ray-shielding layer which may be caused during the peeling of the cover sheet, and the like, and the selection of a developing solvent in a broad range is made possible. The photosensitive element for flexographic printing is suitable for the plate-making process in which a digitized image is drawn directly with an infrared laser without using a phototool such as a negative film.

DESCRIPTION OF THE PREFERRED EMBODIMENTS

As the support layer (a) to be used in this invention, there can be used a dimension-stable film such as polyester, steel, or aluminum having a thickness of 75 $\mu$m to 300 $\mu$m, and if necessary, an adhesive may be used between the support layer (a) and the photosensitive layer (b).

The photosensitive resin layer (b) in this invention is preferably composed of a thermoplastic elastomer obtained by polymerization of a monovinyl-substituted aromatic hydrocarbon and a conjugated diene, as a binder polymer, at least one ethylenically unsaturated monomer and a photopolymerization initiator. In addition, an additive such as a sensitizer, a thermal polymerization inhibitor, a plasticizer, a coloring agent or the like can be contained depending upon the characteristics required for the photosensitive resin layer. And the photosensitive resin layer is preferably insensitive to the infrared ray.

In a thermoplastic elastomer obtained by polymerization of a monovinyl-substituted aromatic hydrocarbon monomer and a conjugated diene monomer and used as the binder polymer for the photosensitive resin layer, styrene, a-methylstyrene, p-methylstyrene, p-methoxystyrene or the like is used as the monovinyl-substituted aromatic hydrocarbon monomer, and butadiene, isoprene or the like is used as the conjugated diene monomer. Representative examples are a styrene-butadiene-styrene block copolymer, a styrene-isoprene-styrene block copolymer and the like.

As the above-mentioned, at least one ethylenically unsaturated monomer, there can be used those compatible with the binder polymer, and examples thereof include esters of alcohols such as t-butyl alcohol, lauryl alcohol and the like with acrylic acid and methacrylic acid; maleimide derivatives such as lauryl maleimide, cyclohexyl maleimide, benzyl maleimide and the like; and esters of alcohols with fumaric acid such as dioctyl fumarate and the like; and further esters of polyhydric alcohols with acrylic acid and methacrylic acid such as hexanediol di(meth)acrylate, nonanediol di(meth)acrylate, trimethylolpropane tri(meth)acrylate; and the like.

Moreover, the photopolymerization initiator is selected from known photopolymerization initiators, for example, aromatic ketones such as benzophenone; benzoin ethers such as benzoin methyl ether, benzoin ethyl ether, benzoin isopropyl ether, α-methylolbenzoin methyl ether, α-methoxybenzoin methyl ether, α-ethoxybenzoin ethyl ether and the like; etc. and they can be used alone or in combination of two or more.

Furthermore, the photosensitive resin layer can contain additives such as a sensitizer, a thermal polymerization inhibitor, a plasticizer, a coloring agent and the like depending upon the characteristics required.

The photosensitive resin layer can be prepared by various methods. For example, with the composition mentioned above, the starting materials to be mixed are dissolved in a suitable solvent, for example, chloroform, tetrachloroethylene, methyl ethyl ketone, toluene or the like to mix them, the resulting solution is cast into a molding frame, the solvent is evaporated and the mixture as produced is formed into a plate. Moreover, without using the solvent, the starting materials can be kneaded in a kneader or on a roll mill and then the resulting mixture is formed into a plate having the desired thickness by an extruder, an injection molding machine, a press or the like.

The non-infrared ray-shielding layer (c) which can be ablated with an infrared laser in this invention is composed of a binder polymer, an infrared absorber and a non-infrared ray-shielding material. The term "non-infrared ray" used herein means wavelengths of light other lights than infrared rays, for example, ultraviolet light and the like.

As the binder polymer, there are used a copolymer composed of a monovinyl-substituted aromatic hydrocarbon such as styrene, α-methylstyrene, vinyl-toluene or the like and a conjugated diene such as butadiene, isoprene or the like; or a hydrogenation product of a copolymer composed of a monovinyl-substituted aromatic hydrocarbon and a conjugated diene. It has been found that the non-infrared ray-shielding layer comprising one of these binder polymers has a good compatibility with the monomer or the like which is the low molecular material in the photosensitive resin layer, has a strong adhesion to the photosensitive resin layer and also has a good laser-ablating properties of the infrared ray-shielding layer and image-formability of the infrared ray-shielding layer.

In the copolymer of a monovinyl-substituted aromatic hydrocarbon monomer and a conjugated diene monomer, the monovinyl-substituted aromatic hydrocarbon content can be 10–90% to achieve the desired effect of the invention. Particularly when the copolymer is a styrene-butadiene copolymer having a styrene content of 60 to 90% by weight, the tackiness of the surface of the non-infrared ray-shielding layer which can be ablated with an infrared laser is low and further the peeling resistance when this layer is transferred from a cover sheet to the photosensitive resin layer is small, so that the peeling is easy. Therefore, said styrene-butadiene copolymer is preferred. Furthermore, when the styrene-butadiene copolymer is a block copolymer, the above-mentioned effect becomes more remarkable, so that the block copolymer is more preferable.

With a hydrogenation product of a styrene-butadiene copolymer having a styrene content of 10 to 50% by weight, there is an advantage that the contraction and expansion properties of the non-infrared ray-shielding layer which can be ablated with an infrared laser are great, and cracks are hardly caused on the surface, so that the hydrogenation product is preferred. In this case, too, when the styrene-butadiene copolymer of the hydrogenation product is a block copolymer, the above-mentioned effect becomes more remarkable, so that the block copolymer is more preferable.

The styrene content of the polymer can be determined by measuring the absorbance due to benzene ring at 260 to 290 nm by an ultraviolet spectrophotometer.

As the infrared absorber, there is usually used a single substance or compound having a strong absorption in the range of from 750 to 2,000 nm. Examples of such infrared absorbers include inorganic pigments such as carbon black, graphite, copper chromite, chromium oxide and the like; dyes such as polyphthalocyanine compound, cyanine dye, metal thiolate dye and the like. Particularly, carbon black can have a particle size in a wide range of 13–85 nm and a higher sensitivity to infrared laser with a less particle size. These infrared absorbers are added to such an extent as to impart such a sensitivity that the non-infrared ray-shielding layer can be ablated with the laser light to be used. In general, the addition in an amount of 10 to 80% by weight is effective.

As the non-infrared ray-shielding material, there can be used a material which reflects or absorbs ultraviolet lights. Good examples thereof are ultra-violet absorbers, carbon black, graphite and the like, and it is necessary to set the addition amount so that the required optical density can be achieved. In general, it is necessary to add the above material so that the optical density becomes at least 2.0, preferably at least 3.0.

When carbon black is used serving both as the infrared absorber and the non-infrared ray-shielding material, an example of a preparation method is a method which comprises preparing a binder polymer solution using a suitable solvent, dispersing carbon black therein, then coating the resulting dispersion on a cover sheet such as a polyester film or the like, and thereafter, laminating or contact-bonding this cover sheet to the photosensitive resin layer to transfer the infrared ray-shielding layer which can be ablated with an infrared laser, and this method is effective.

As the method of dispersing carbon black in the binder polymer solution, there is effective a method which uses in combination, forced agitation by a stirring blade and agitation by utilizing ultrasonic waves. Alternatively, a method which comprises pre-kneading the binder polymer with the carbon black using an extruder or a kneader and then dissolving the resulting mixture in a solvent is also effective for good dispersion of carbon black. Also, the carbon black may be forced to be dispersed in the polymer in the state of a latex solution. The thickness of the noninfrared ray-shielding layer should be determined taking into consideration the sensitivity of ablation with an infrared laser and the non-infrared ray-shielding effect; however, it is usually set in the range of from 0.1 to 20 g/m$^2$, preferably from 1 to 5 g/m$^2$.

As the cover sheet (d) in this invention, a polyethylene film, a polypropylene film or the like having a thickness of 20 to 200 μm or a laminate thereof is used; however, the cover sheet is present for the purpose of protecting the non-infrared ray-shielding layer, and is removed before the drawing of an image with an infrared laser.

As the infrared laser to be used in the plate-making process, there can be employed those having a wavelength of 750 to 2,000 nm. As general lasers of this type of infrared laser, are semiconductor lasers having a wavelength of 750 to 880 nm and an Nd-YAG laser having a wavelength of 1,060 nm. The generation unit of these lasers is controlled, together with a driving system unit, by a computer, and digitized image information is given to the photosensitive element for flexographic printing by selectively ablating the non-infrared ray-shielding layer on the photosensitive resin layer.

The ultraviolet light source to be used for photocuring the photosensitive resin layer of the photosensitive element for flexographic printing after completion of the drawing of an image with an infrared laser includes a high pressure mercury vapor lamp, an ultraviolet fluorescent lighting, a carbon-arc lamp, a xenon lamp, solar rays and the like. The desired relief image can be obtained by irradiation with an ultraviolet light from the image side. However, in order to make the relief image more stable against the stress when the uncured portion is removed by washing, it is effective to conduct the whole surface exposure from the support layer side, too.

As the developing solvent to be used to remove the non-infrared ray-shielding layer and the unexposed portion of the photosensitive resin layer by washing after the formation of the relief image by irradiation of the photosensitive resin layer with an ultraviolet light, there are used, for example, chlorine-containing organic solvents such as 1,1, 1-trichloroethane, tetrachloroethylene and the like; esters such as heptyl acetate, 3-methoxybutyl acetate and the like; and hydrocarbons such as petroleum cut, toluene, decalin and the like. Moreover, mixtures of these solvents with alcohols such as propanol, butanol, pentanol and the like can also be used. The removal of the non-infrared ray-shielding layer and the unexposed portion of the photosensitive resin layer by washing is conducted by injection from a nozzle or brushing with a brush. The printing plate obtained is finished by washing with a rinse, drying and thereafter subjecting to postexposure.

This invention is explained in more detail based on Examples; however, this invention should not be construed to be limited to the Examples.

EXAMPLE 1 TO 3 AND COMPARATIVE EXAMPLES 1 AND 2

A mixture obtained by kneading 50 parts by weight of one of the following polymers as a binder polymer of a non-infrared ray-shielding layer with 50 parts by weight of carbon black having a particle size of 84 nm (general purpose color black #10 manufactured by Mitsubishi Chemical) in a kneader was dissolved and dispersed in a mixed solvent of toluene/ethyl acetate =⅕ by volume to prepare a 5% by weight uniform solution:

EXAMPLE 1

Tufprene 315 (a styrene-butadiene block copolymer having a styrene content of 20% by weight manufactured by Asahi Kasei Kogyo K. K.).

EXAMPLE 2

Asaprene 420 (a styrene-butadiene block copolymer having a styrene content of 40% by weight manufactured by Asahi Kasei Kogyo K. K.).

EXAMPLE 3

Kraton D-1107 (a styrene-isoprene block copolymer having a styrene content of 14% by weight manufactured by Shell Chemical).

Comparative Example 1

Macromelt 6900 (polyamide manufactured by Henkel).

Comparative Example 2

CAB-381-0.1 (cellulose acetate butyrate manufactured by Kodak).

Subsequently, the above solution was coated by a knife coater on a polyester film which became a cover sheet having a thickness of 100 $\mu$m so that the amount of the coating after drying became 5 to 6 g/m$^2$, and dried at 80° C. for one minute, to prepare a non-infrared ray-shielding layer which can be ablated with an infrared laser. The optical densities of the screening layers were measured by DM-500 (manufactured by DAINIPPON SCREEN MFG. CO., LTD.) to obtain the results shown in Table 1.

Subsequently, 60 parts by weight of Tufprene A (a styrene-butadiene-styrene block copolymer manufactured by Asahi Kasei Kogyo K. K.), 30 parts by weight of B-2000 (a liquid polybutadiene manufactured by NIPPON OIL CO., LTD.), 7 parts by weight of 1,9-nonanediol diacrylate, 2 parts by weight of 2,2-dimethoxy-2-phenyl acetophenone and 0.3 part by weight of 2,6-di-t-butyl-p-cresol were kneaded in a kneader, to prepare a photo-sensitive resin composition. This photosensitive resin composition was nipped by a support of a 125-$\mu$ polyester film and the previously prepared non-infrared ray-shielding layer on the cover sheet and thereto was applied a pressure of 200 kg/cm$^2$ by a pressing machine using a 3-mm spacer at 130° C. for 4 minutes to mold a photosensitive element for flexographic printing.

The cover sheet of the above photosensitive element for flexographic printing was peeled to transfer the non-infrared ray-shielding layer to the photosensitive resin layer. In this case, the non-infrared ray-shielding layer was firmly adhered to the photosensitive resin layer and neither partial peeling nor burr was found in Examples 1 to 3. However, in Comparative Example 1, such a problem was caused that a part of the non-infrared ray-shielding layer was stripped off as attached to the cover sheet.

Subsequently, the element were mounted on the drum of a laser-writing device and subjected to triplicate irradiation with a semiconductor laser having an energy density of 2.2 MW/cm$^2$ so as to obtain a halftone dot pattern of 3%-120 lines/inch, thereby selectively ablating each of the infrared ray-shielding layers.

The element that the ablation of the non-infrared ray-shielding layer had been completed was, first, subjected to back exposure of 300 mJ/cm$^2$ from the support side and successively to relief exposure of 8,000 mJ/cm$^2$, on an AFP-1500 exposing machine (manufactured by Asahi Kasei Kogyo K. K.) using an ultraviolet fluorescent lighting having a center wavelength of 370 nm. The exposure intensity at this time was such that the intensity obtained by measuring on a glass plate the ultraviolet light from the lower lamp which was on the side that the back exposure was conducted was 4.0 mW/cm$^2$ and the intensity obtained by measuring the ultraviolet light from the upper lamp that was on the relief exposure side was 7.8 mW/cm$^2$, the measurement having been carried out through a UV-35 filter using a UV illuminometer Model MO-2 machine manufactured by Oak Seisakusho.

Next, each of tetrachloroethylene (Solvent A), tetrachloroethylene/n-butanol (volume ratio: 3/1, Solvent B), NYLOSOLV-II (manufactured by BASF, Solvent C), 3-methoxybutyl acetate (Solvent D) and toluene (Solvent E) was used as a developer and development was conducted at a liquid temperature of 25° C. for 5 minutes in the state that the element was attached with a double bond tape to the revolving cylinder of an AFP-1500 developing machine (manufactured by Asahi Kasei Kogyo K. K.). In this case, as seen from the results in Table 1, only when a copolymer of styrene and a conjugated diene was used as the binder polymer of the non-infrared ray-shielding layer, development residues such as undissolved non-infrared ray-shielding layer floating in the developer, the re-attachment thereof to the plate surface and the like were not found, and a good developability was shown as to all the developing solvents.

TABLE 1

| | Binder polymer of non-infrared ray-shielding layer | Optical density | Developing solvent and developability | | | | |
|---|---|---|---|---|---|---|---|
| | | | Solvent A | Solvent B | Solvent C | Solvent D | Solvent E |
| Example 1 | Tufprene 315 | 3.5 | Good | Good | Good | Good | Good |
| Example 2 | Asaprene 420 | 3.2 | Good | Good | Good | Good | Good |
| Example 3 | Kraton D-1107 | 3.3 | Good | Good | Good | Good | Good |
| Comparative Example 1 | Macromelt 6900 | 3.8 | Residue existed | Good | Good | Residue existed | Good |
| Comparative Example 2 | CAB-551-0.2 | 3.6 | Good | Good | Residue existed | Good | Residue existed |

EXAMPLE 4

A mixture obtained by kneading 65 parts by weight of Asaflex 815 [a styrene-butadiene block polymer having a styrene content of about 77% by weight (as measured by an ultraviolet spectrophotometry) manufactured by Asahi Kasei Kogyo K. K.] and 35 parts by weight of carbon black having a particle size of 30 nm (general purpose color black #30 manufactured by Mitsubishi Chemical) in a kneader was dissolved and dispersed in a mixed solvent of toluene/ethyl acetate=1/9 by volume to prepare a 5% by weight uniform solution. Subsequently, this solution was coated by a knife coater on a polyester film which became a cover sheet having a thickness of 100 μm so that the amount of the coating after drying became 5 to 6 g/m$^2$ and then dried at 80° C. for one minute to prepare a non-infrared ray-shielding layer which can be ablated with an infrared laser. The surface of this non-infrared ray-shielding layer was not tacky and was easy to handle. The optical density was determined as about 3.2.

Subsequently, the photosensitive resin composition obtained in Example 1 and the above non-infrared ray-shielding layer on the cover sheet were subjected to molding in the same manner as in Example 1 to prepare a photosensitive element for flexographic printing.

The cover sheet of this photosensitive element for flexographic printing was peeled. In this case, the cover sheet was easily peeled and the non-infrared ray-shielding layer was rapidly transferred to the photosensitive resin layer. Moreover, the non-infrared ray-shielding layer was firmly adhered to the photosensitive resin layer and neither peeling nor burr were found. Even at this time, tackiness of the surface of the non-infrared ray-shielding layer was hardly felt. This element was mounted on the drum of a laser-writing device and the non-infrared ray-shielding layer was selectively ablated using an Nd-YAG laser having an energy density of 10 MW/cm$^2$ to draw a halftone dot pattern of 3%-120 lines/inch.

Next, in the same manner as in Example 1, the element was subjected to back exposure and relief exposure and thereafter to development at a liquid temperature of 25° C. using one of Solutions A to E shown in Example 1 as a developer in the state that the element was attached with a double bond tape to the revolving cylinder of an AFP-1500 developing machine (manufactured by Asahi Kasei Kogyo K. K.). In this case, the development was completed within 3 to 7 minutes as to all the solvents and a good relief image free from development residues and the like was obtained.

EXAMPLE 5

A mixture obtained by kneading 60 parts by weight of Taftec M1913 (a hydrogenation product of a styrene-butadiene block copolymer having a styrene content of 30% by weight manufactured by Asahi Kasei Kogyo K. K.) and 40 parts by weight of carbon black having a particle size of 30 nm (general purpose color black #30 manufactured by Mitsubishi Chemical) in a kneader was dissolved and dispersed in toluene to prepare a 5% by weight uniform solution. Subsequently, this solution was coated by a knife coater on a polyester film which became a cover sheet having a thickness of 100 μm so that the amount of the coating after drying became 5 to 6 g/m$^2$ and then dried at 80° C. for one minute to prepare a non-infrared ray-shielding layer which can be ablated with an infrared laser. The surface of this non-infrared ray-shielding layer was free from tackiness and easy to handle, and the optical density was determined as about 4.0.

Next, the photosensitive resin composition obtained in Example 1 and the above-mentioned infrared ray-shielding layer on the cover sheet were subjected to molding in the same manner as in Example 1 to prepare a photosensitive element for flexographic printing.

The cover sheet of this photosensitive element for flexographic printing was peeled. In this case, the cover sheet was easily peeled and the non-infrared ray-shielding layer was completely transferred to the photosensitive resin layer. Moreover, the contraction and expansion properties were good and even when the element was advertently bent, no crack or the like was observed on the surface and the adhesiveness to the photosensitive resin layer was good.

This element was subjected to writing by a laser and to exposure for formation of a relief under the same conditions as in Example 4, and thereafter to development with one of Solvents A to E shown in Example 1. The development was completed within 3 to 7 minutes as to all the solvents and a good relief image free from development residues or the like was obtained.

What is claimed is:

1. A photosensitive element for flexographic printing comprising (a) a support layer; (b) a photosensitive resin layer which comprises, as a binder polymer, a thermoplastic elastomer obtained by polymerization of a monovinyl-substituted aromatic hydrocarbon and a conjugated diene, said photosensitive resin layer (b) is on the support layer (a); and (c) a non-infrared ray-shielding layer which can be ablated with an infrared laser, and comprises a binder polymer, an infrared absorber and a non-infrared ray-shielding material, said non-infrared ray-shielding layer (c) is directly on the photosensitive resin layer (b), wherein the photosensitive resin layer (b) further comprises, at least one ethylenically unsaturated monomer capable of being radically polymerized and a photopolymerization initiator; and wherein the binder polymer of the non-infrared ray-shielding layer (c) is a styrene-conjugated diene copolymer having a styrene content of 60 to 90% by weight or a hydrogenation product of a styrene-conjugated diene copolymer having a styrene content of 10 to 50% by weight.

2. The photosensitive element for flexographic printing according to claim 1, wherein (d) a cover sheet is further placed on the non-infrared ray-shelding layer (c).

3. The photosensitive element for flexographic printing according to claim 1, wherein the thermoplastic elastomer of the photosensitive layer is obtained by copolymerization of styrene, α-methylstyrene, p-methylstyrene, or p-methoxystyrene with butadiene or isoprene.

4. The photosensitive element for flexographic printing according to claim 1, wherein the at least one ethylenically unsaturated monomer capable of being radically polymerized is selected from the group consisting of:

(1) esters of t-butyl alcohol or lauryl alcohol with acrylic acid or methacrylic acid;

(2) lauryl maleimide, cyclohexyl maleimide, or benzyl maleimide; and (3) dioctyl fumarate, hexanediol di(meth)acrylate, nonanediol di(meth)acrylate or trimethylolpropane tri(meth)acrylate.

5. The photosensitive element for flexographic printing according to claim 1, wherein the photopolymerization initiator is selected from the group consisting of aromatic ketones, benzoin ethers, and combinations thereof.

6. The photosensitive element for flexographic printing according to claim 1, wherein the photopolymerization initiator is selected from the group consisting of benzophenone, benzoin methyl ether, benzoin ethyl ether, benzoin isopropyl ethers α-methylolbenzoin methyl ether, α-methoxybenzoin methyl ether, α-ethoxybenzoin ethyl ether, and combinations thereof.

7. The photosensitive element for flexographic printing according to claim 1, wherein the infrared absorbers are selected from include inorganic pigments such as carbon black, graphite, copper chromite, chromium oxide, a polyphthalocyanine, a cyanine dye, and a metal thiolate dye.

8. The photosensitive element for flexographic printing according to claim 7, wherein the carbon black has a particle size in a range of 13–85 nm.

9. The photosensitive element for flexographic printing according to claim 1, wherein the noninfrared ray shielding material is selected from the group consisting of ultraviolet absorbers, carbon black and graphite.

10. The photosensitive element for flexographic printing according to claim 1, wherein the non-infrared ray-shielding layer (c) consists essentially of a binder polymer, an infrared absorber and a non-infrared ray-shielding material, wherein the binder polymer consists of a copolymer of a monovinyl-substituted aromatic hydrocarbon and a conjugated diene or a hydrogenation product of a copolymer of a monovinyl-substituted aromatic hydrocarbon and a conjugated diene.

11. The photosensitive element for flexographic printing according to claim 1, wherein the non-infrared ray-shielding layer (c) consists of a binder polymer, an infrared absorber and a non-infrared ray-shielding material, wherein the binder polymer consists of a copolymer of a monovinyl-substituted aromatic hydrocarbon and a conjugated diene or a hydrogenation product of a copolymer of a monovinyl-substituted aromatic hydrocarbon and a conjugated diene.

* * * * *